United States Patent [19]
Kobayashi et al.

[11] Patent Number: 6,022,813
[45] Date of Patent: Feb. 8, 2000

[54] METHOD AND APPARATUS FOR MANUFACTURING SEMICONDUCTOR DEVICES

[75] Inventors: Hikaru Kobayashi, Kyoto; Kenji Yoneda, Takatsuki, both of Japan

[73] Assignees: Japan Science and Technology Corporation; Matsushita Electronics Corporation, both of Japan

[21] Appl. No.: 08/916,376

[22] Filed: Aug. 22, 1997

[30] Foreign Application Priority Data

Sep. 2, 1996 [JP] Japan .................................. 8-232021

[51] Int. Cl.[7] ...................................... H01L 45/80
[52] U.S. Cl. .................................. 438/778; 357/2
[58] Field of Search ............................... 438/778

[56] References Cited

U.S. PATENT DOCUMENTS

| | | |
|---|---|---|
| 4,350,541 | 9/1982 | Mizushima et al. ............... 148/188 |
| 4,769,682 | 9/1988 | Yang et al. . |
| 4,801,474 | 1/1989 | Saitoh et al. .................... 427/248.1 |
| 4,914,054 | 4/1990 | Moriyama et al. .................. 437/183 |
| 5,164,225 | 11/1992 | Nire et al. ........................ 427/125 |
| 5,296,407 | 3/1994 | Eguchi ............................. 437/195 |
| 5,880,802 | 3/1999 | Kouno et al. ..................... 349/138 |

*Primary Examiner*—Charles Bowers
*Assistant Examiner*—Martin Sulsky
*Attorney, Agent, or Firm*—Lorusso & Loud

[57] ABSTRACT

There are disclosed a method and apparatus for manufacturing semiconductor devices. The surface of each semiconductor substrate is exposed to cyanide ions ($CN^-$) in order to reduce the density of interface states at the insulating film/semiconductor interface. For this purpose, the semiconductor substrate is immersed into a cyan compound solution or is exposed to a cyan compound gas, so that cyanide ions ($CN^-$) are bonded to dangling bonds at the surface of the semiconductor substrates. As a result, the interface states at the insulating film/semiconductor interface can be reduced.

27 Claims, 8 Drawing Sheets

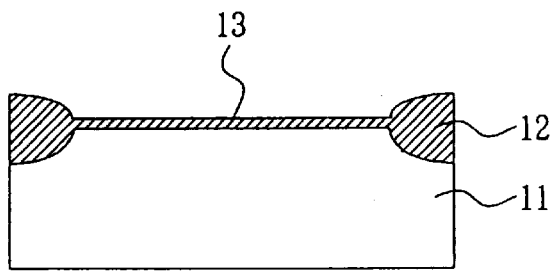
F I G. 5 (a)
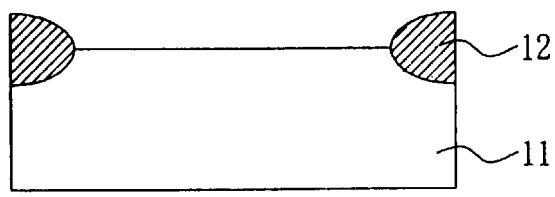
F I G. 5 (b)
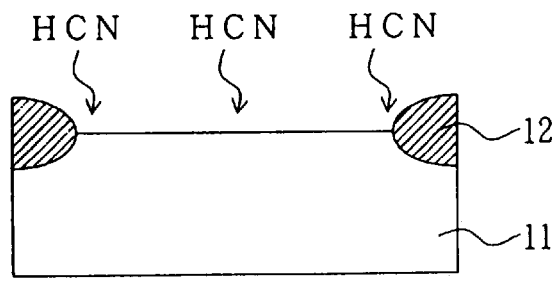
F I G. 5 (c)
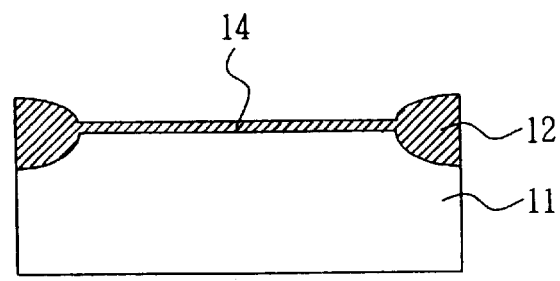
F I G. 5 (d)
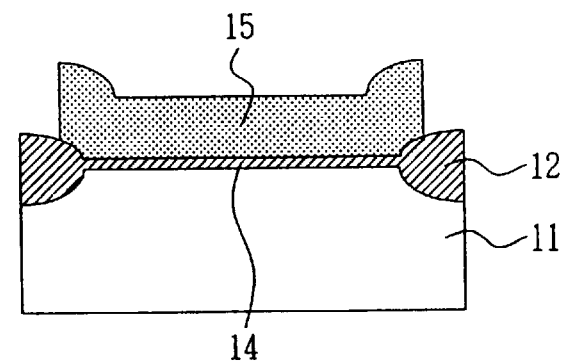
F I G. 5 (e)

METHOD AND APPARATUS FOR MANUFACTURING SEMICONDUCTOR DEVICES

BACKGROUND OF THE INVENTION

1. Field of the Invention

The present invention relates to a method and apparatus for manufacturing semiconductor devices, particularly metal insulator semiconductor (MIS) devices, which can improve the performance of the devices, and more particularly to a method and apparatus for manufacturing semiconductor devices which can reduce interface states at the interface between an insulating film and the semiconductor substrate of the device.

2. Description of the Related Art

In semiconductor devices, particularly metal insulator semiconductor (MIS) devices, the energy levels within the band-gap existing at the interface between the insulating film and the semiconductor substrate of the device; i.e., so-called interface states, adversely affect the electrical characteristics of the MIS devices. Therefore, there has been a great demand for reduction of the density of the interface states.

Among MIS devices, MOS (metal oxide semiconductor) devices are in most common use. In the MOS devices, the interface states existing at the interface between the insulating film and the semiconductor substrate cause a decrease in the mobility of carriers, instability in the flat band voltage, a decrease in reliability in relation to breakdown of the oxide film, and an increase in a leak current density. Among these problems, an increase in the leak current density is a significant problem to be solved.

Conventionally, a reduction in the density of the interface states has been performed through use of a method in which an oxide film is formed on a semiconductor substrate, which is then heated in a hydrogen atmosphere or in an atmosphere of an inert gas such as nitrogen or argon (see, for example, B. E. Deal, Journal of Electrochemical Society, Vol. 144, p. 226, 1967). It is considered that when a semiconductor substrate having an oxide film is subjected to heat treatment in a hydrogen atmosphere, hydrogen atoms terminate dangling bonds at the surface of the semiconductor resulting in the deactivation of the dangling bonds, so that the density of the interface states can be reduced.

However, in the conventional method, the semiconductor substrate must be heated to a temperature as high as 400–1200° C. when the heat treatment is performed in a hydrogen atmosphere and to a temperature as high as 900–1200° C. when the heat treatment is performed in a nitrogen or argon atmosphere. Also, when the heat treatment is performed in a hydrogen atmosphere, the bonding force between the semiconductor substrate and hydrogen atoms is not strong, and therefore the dangling bonds can be easily terminated at a temperature as low as 400° C. However, the hydrogen atoms bonded to the semiconductor substrate through heat treatment are easily released when the semiconductor substrate is heated to a temperature higher than that used during the heat treatment, and the effect disappears. Therefore, a limitation is imposed on the temperatures used in heat treatment processes subsequent to the hydrogen process.

Meanwhile, a high temperature annealing process in an inert gas such as nitrogen or argon has been used. However, the purpose of this high temperature annealing is not to terminate dangling bonds of a semiconductor with nitrogen atoms or argon atoms, but to align the crystals of the semiconductor. Therefore, heat treatment must be performed at a temperature of 900° C. or more. However, heat treatment performed at a temperature of 900° C. or more is not suitable for micro-devices, which must be subjected to heat treatment of a lower temperature; otherwise the depth of diffusion becomes too large.

SUMMARY OF THE INVENTION

An object of the present invention is to solve the above-described problems of the conventional method of reducing the density of the interface states of semiconductor devices and to provide an apparatus and method for manufacturing semiconductor devices which can reduce the density of the interface states at the semiconductor/insulating film interface without use of hydrogen or high temperature heating.

In order to achieve the above object, the present invention provides a method of manufacturing a semiconductor device comprising the steps of: exposing the surface of a semiconductor substrate of a predetermined conduction type to cyanide ions ($CN^-$) and forming an insulating film on the semiconductor substrate.

The present invention provides another method of manufacturing a semiconductor device comprising the steps of: exposing the surface of a semiconductor substrate of a predetermined conduction type to cyanide ions ($CN^-$); forming an insulating film on the semiconductor substrate; forming an electrically conductive film on the insulating film; and processing the electrically conductive film to form a electrode.

The present invention provides still another method of manufacturing a semiconductor device comprising the steps of: exposing the surface of a semiconductor substrate of a predetermined conduction type to cyanide ions ($CN^-$); forming a thin insulating film on the semiconductor substrate; and forming a transparent electrode on the insulating film.

In the above-described methods, the step of exposing the surface of a semiconductor substrate of a predetermined conduction type to cyanide ions ($CN^-$) may be a step of dipping the semiconductor substrate into a cyan compound solution containing cyanide ions ($CN^-$). Alternatively, the step of exposing the surface of a semiconductor substrate of a predetermined conduction type to cyanide ions ($CN^-$) may be a step of exposing the semiconductor substrate to a cyan compound gas.

In the above-described methods, the cyan compound is preferably selected from a group consisting of potassium cyanide (KCN), sodium cyanide (NaCN), hydrogen cyanide (HCN), and cyanogen [$(CN)^2$].

In the above-described method, the semiconductor substrate is preferably formed of a material selected from the group consisting of single crystalline silicon, polycrystalline silicon, amorphous silicon, gallium arsenide, and indium phosphide.

In the above-described method, the insulating film is preferably formed of a material selected from the group consisting of silicon dioxide, silicon nitride, tantalum pentoxide ($Ta_2O_5$), BST ($BaSrTiO_3$), and STO ($SrTiO_3$).

In the above-described method, when the surface of a semiconductor substrate is exposed to cyanide ions ($CN^-$), heat may be applied to the semiconductor substrate and/or ultraviolet rays may be radiated on the semiconductor substrate.

The present invention also provides an apparatus for manufacturing a semiconductor device comprises: a spare chamber through which a semiconductor wafer is transported to and from the apparatus; a reaction chamber for carrying out a cyanide treatment; a post treatment chamber for carrying out a process subsequent to the cyanide treatment; and a transportation chamber through which the semiconductor wafer is transported between the spare chamber, the reaction chamber, and the post treatment chamber. The reaction chamber is formed of a transparent material having corrosion-resistance, and the semiconductor wafer is held horizontally in the reaction chamber for single wafer processing. A light source for radiating ultraviolet rays is disposed at the upper portion of the reaction chamber, and a light source for radiating infrared rays is disposed at the lower portion of the reaction chamber. A cyan compound is introduced into and discharged from the chamber in a direction parallel to the surface of the semiconductor wafer. The reaction chamber is further provided with a device for evacuating the reaction chamber. The post treatment process chamber has a mechanism for rotating the semiconductor wafer while holding the reverse surface of the semiconductor wafer and for supplying the semiconductor wafer with ultra de-ionized water and nitrogen from a nozzle provided above the wafer.

According to the present invention, the density of the interface states at the insulator/semiconductor interface can be reduced at a low temperature within a short time, without use of hydrogen annealing or high temperature annealing in an inert gas atmosphere, and the effect does not disappear during a subsequent heat treatment process. Therefore, the performance of MIS devices (particularly MOS devices), pn-junction photodiodes, and MOS tunnel diodes can be improved.

BRIEF DESCRIPTION OF THE DRAWINGS

FIGS. 5A–5E are cross-sectional views showing, a process for manufacturing a MOS capacitor according to a second embodiment of the present invention;

DESCRIPTION OF THE PREFERRED EMBODIMENTS

Preferred embodiments of the present invention will now be described in detail with reference to the drawings.

FIGS. 1A–1E show a process for manufacturing a MOS tunnel diode according to a first embodiment of the present invention. Now, a description will be given a method of reducing the density of the interface states at the interface between the semiconductor substrate and the insulating film through use of a cyan compound.

Examples of the semiconductor used in the present embodiment include single crystalline silicon, polycrystalline silicon, amorphous silicon, gallium arsenide, and indium phosphide. Examples of materials used for the insulating film include silicon dioxide, silicon nitride, tantalum pentoxide ($Ta_2O_5$), BST ($BaSrTiO_3$), and STO ($SrTiO_3$).

Examples of the cyan compound include potassium cyanide (KCN) sodium cyanide (NaCN), hydrogen cyanide (HCN), and cyanogen [$(CN)^2$].

Figure 1A:
FIGS. 1A–1E are cross-sectional views showing a process for manufacturing a MOS tunnel diode according to a first embodiment of the present invention.

First, as shown in FIG. 1A, a semiconductor wafer sliced from an ingot that had been grown in accordance with the CZ method was used as a single crystalline silicon substrate 1 (hereinafter simply referred to as the "silicon substrate"). At this time, a native oxide film 2 was formed on the silicon substrate 1.

Figure 1B:

Subsequently, as shown in FIG. 1B, the surface of the silicon substrate 1 was cleaned through use of a known RCA cleaning method (W. Kern, D. A. Plutien: RCA review, Vol. 31, p. 187, 1970), and was immersed into diluted hydrofluoric acid (0.5 vol. % aqueous solution) for 5 minutes in order to remove the native oxide film 2. In order to form a high quality ultrathin oxide film on the silicon substrate 1, the silicon substrate 1 must have a clean surface. Therefore, thorough removal of the native oxide film 2 and impurities from the silicon substrate 1 is important.

Figure 1C:
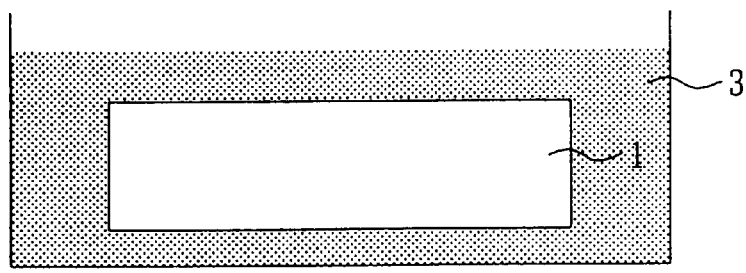

Next, as shown in FIG. 1C, after the silicon substrate 1 was cleaned with ultra de-ionized water for 5 minutes, it was immersed for 1 second into a 0.1 mol potassium cyanide aqueous solution 3. The silicon was then cleaned with boiling water for 10 minutes.

Figure 1D:
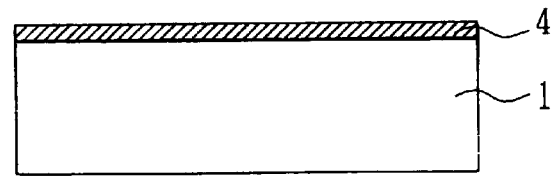

Subsequently, as shown in FIG. 1D, the silicon substrate 1 was heated at 450° C. in the air in order to form a ultrathin silicon oxide film 4.

Figure 1E:
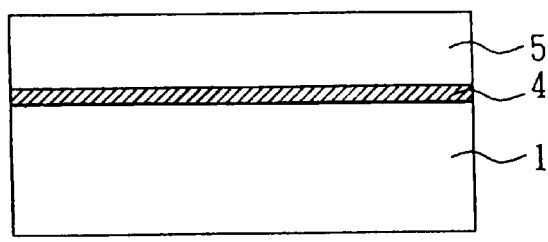

Subsequently, as shown in FIG. 1E, a solution containing $InCl_3$ and $SnCl_4$ in the molar ratio of 10:1 was sprayed onto the silicon substrate (silicon wafer) 1 heated to 450° C. in an electrical furnace. As a result, an indium-tin-oxide (ITO) film 5 was deposited on the ultrathin silicon oxide film 4 as a transparent electrode. Observation of the X-ray photoelectron spectrum revealed that the thickness of the silicon oxide film 4 was approximately 2 nm. Lead wires were connected to the ITO transparent electrode 5 on the front surface of the MOS tunnel diode and to the reverse surface of the silicon substrate 1 in order to perform electrical measurement.

Figure 2:
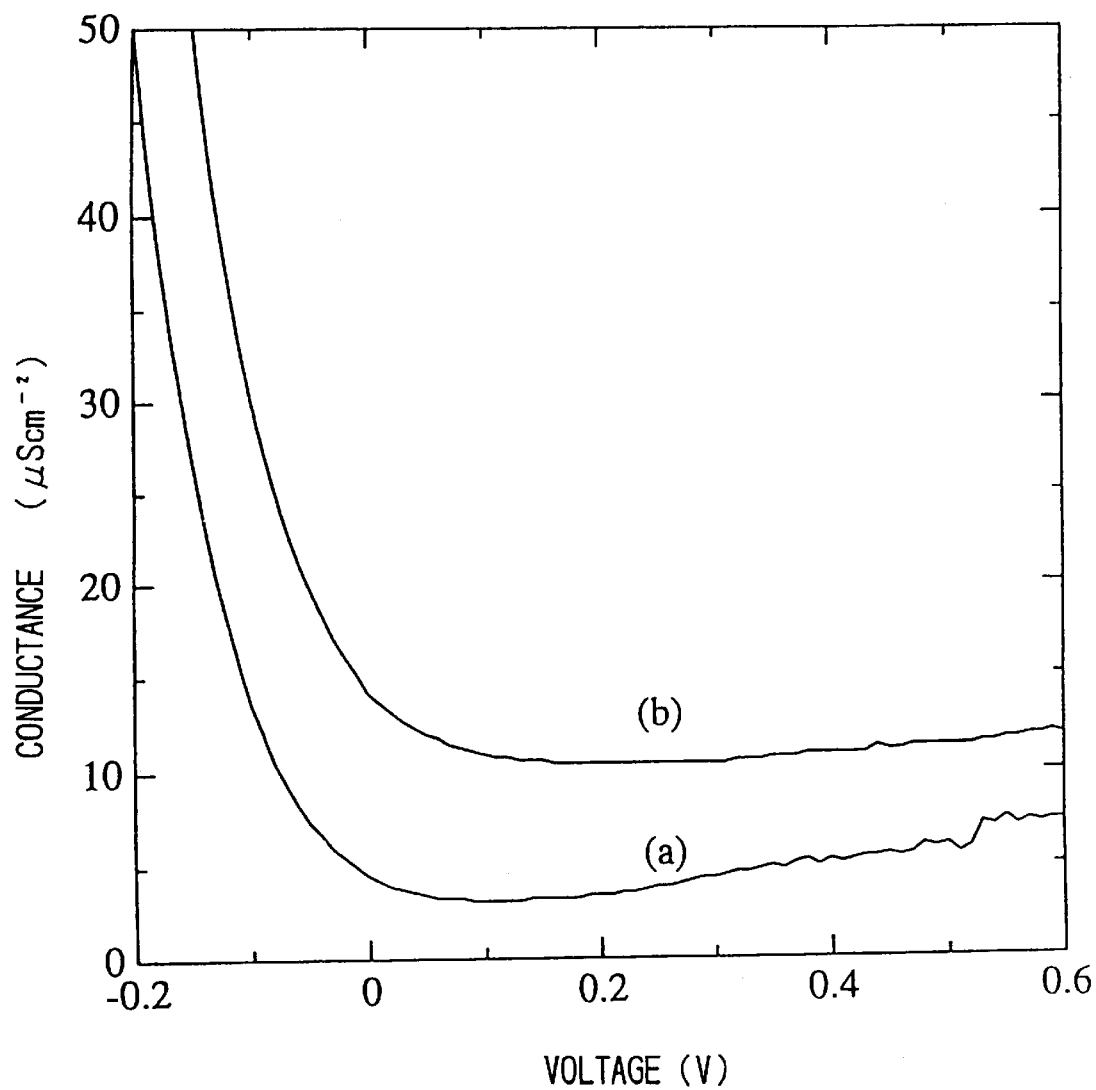
FIG. 2 is a graph showing the conductance-voltage (G-V) characteristic of a MOS tunnel diode that was treated with KCN in accordance with the first embodiment of the present invention and the conductance-voltage (G-V) characteristic of a MOS tunnel diode that was manufactured by a conventional method without the treatment with KCN.

Curve (a) in FIG. 2 shows the conductance-voltage (G-V) characteristic of a MOS tunnel diode that had undergone a treatment with KCN in accordance with the first embodiment of the present invention, and curve (b) in FIG. 2 shows the conductance-voltage (G-V) characteristic of a MOS tunnel diode that was manufactured by a conventional method without the treatment with KCN.

As is apparent from FIG. 2, when the treatment with KCN was performed, the conductance decreased greatly. This suggests that the density of the interface states was reduced.

Figure 3:
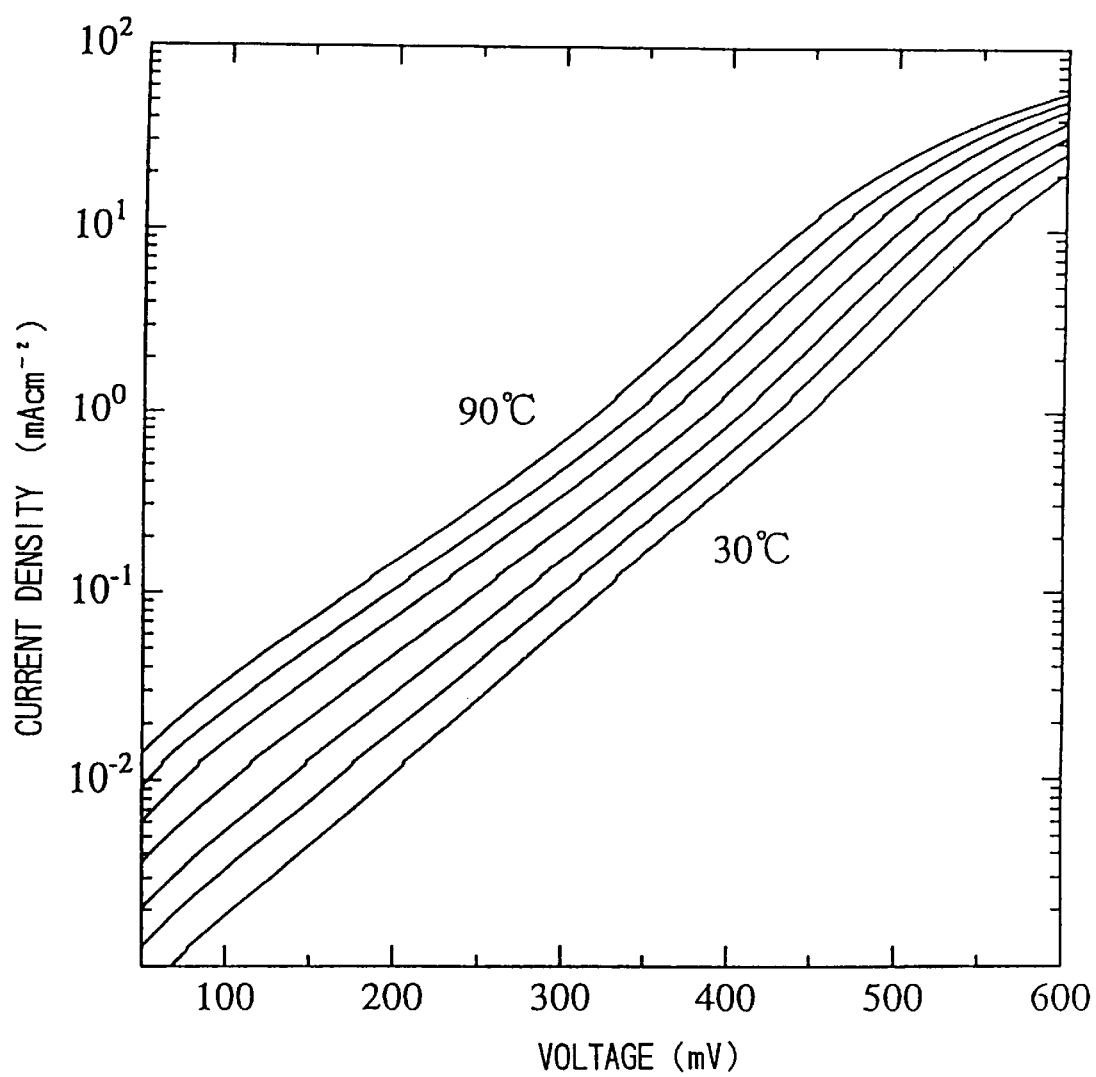
FIG. 3 is a graph showing the current-voltage (I-V) characteristic of the MOS tunnel diode that was treated with KCN in accordance with the first embodiment of the present invention.
Figure 4:
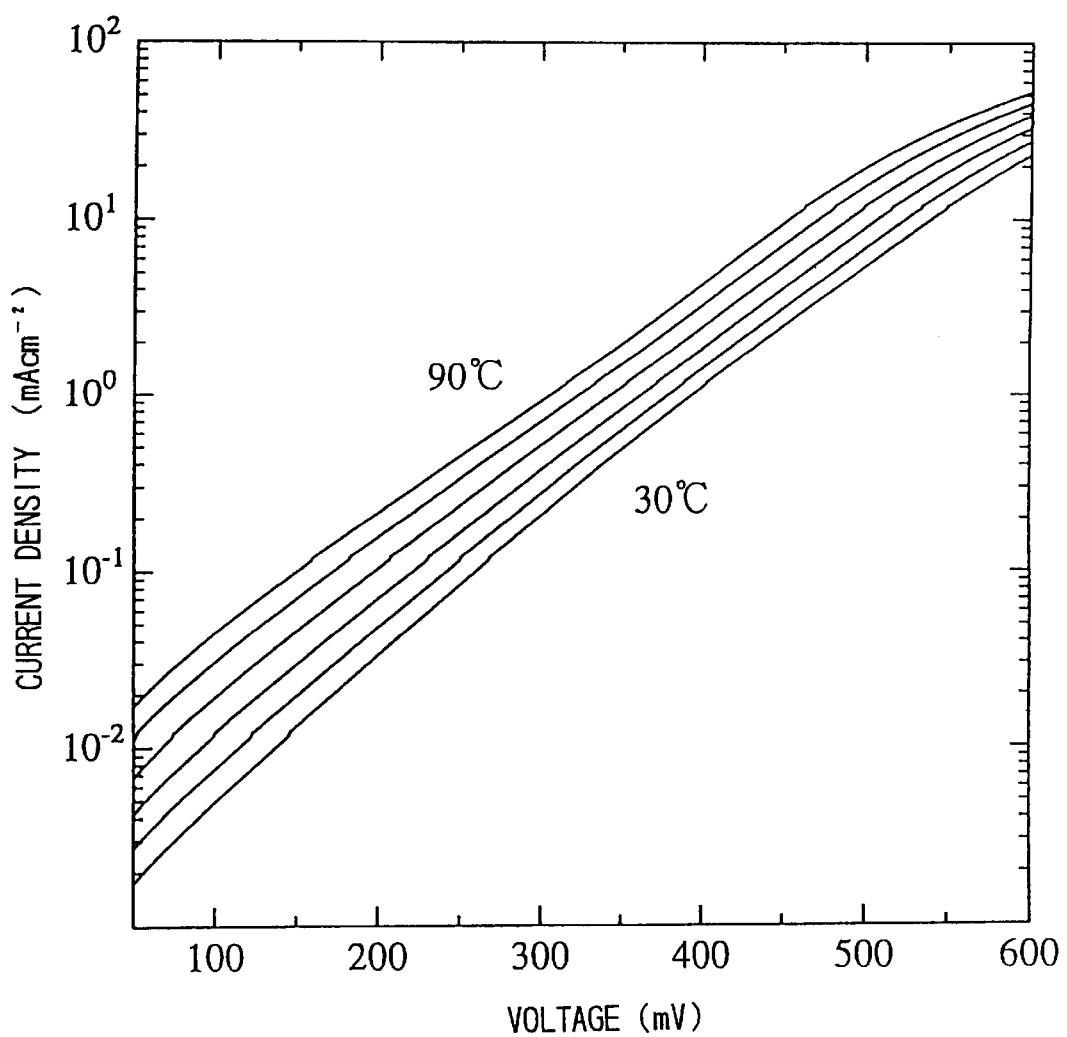
FIG. 4 is a graph showing the current-voltage (I-V) characteristic of the MOS tunnel diode that was manufactured by the conventional method without the treatment with KCN.

FIG. 3 shows the current-voltage (I-V) characteristic of the MOS tunnel diode that had undergone a treatment with KCN. in accordance with the first embodiment of the present invention, while FIG. 4 shows the current-voltage (I-V)

characteristic of the MOS tunnel diode that was manufactured by the conventional method without the treatment with KCN. In both graphs, temperature serves as a parameter.

As is apparent from FIGS. 3 and 4, when the treatment with KCN was performed, the current density of leak current in a low-bias-voltage region of not greater than 250 mV decreased considerably. This test result also shows that the density of the interface states decreased due to the cyanide treatment.

The same effect was obtained when sodium cyanide, hydrogen cyanide, or the like was used instead of potassium cyanide. The chemical mechanism of the reduction of the density of the interface states at the oxide/semiconductor interface due to the cyanide treatment has not been found. However, it is considered that the above-described phenomenon occurs because cyanide ions ($CN^-$) having a strong bonding force bond to dangling bonds existing at the surface of the semiconductor substrate and deactivate the dangling bonds electrically.

In the first embodiment, the concept of the present invention is described with reference to a single crystalline silicon substrate. However, the above-described manufacturing method can be applied to other semiconductor substrates made of gallium arsenide, indium phosphide, amorphous silicon, polycrystalline silicon, or the like. Also, similar effects can be obtained when the above-described manufacturing method is applied to heterojunction substrates of SiGe, SiGeC, etc.

Moreover, the insulating film can be replaced with other types of insulating films such as silicon nitride, tantalum pentoxide, BST, STO, PZT, PLZT, PLT, and Y1.

FIGS. 5A–5E show a process for manufacturing a MOS capacitor according to a second embodiment of the present invention.

First, as shown in FIG. 5A, a p-type semiconductor wafer sliced from an ingot that had been grown in accordance with the CZ method and having a (100) orientation and a resistivity of 10–15 Ω cm was used as a silicon substrate 11. A known LOCOS isolation oxide film 12 of 350 nm was formed as a isolation region. Next, the active region where MOS devices were to be fabricated was cleaned in accordance with the RCA cleaning method in order to remove metal contamination, particle contamination, and organic contamination. Subsequently, in order to further clean the surface; i.e., in order to remove heavy metals from the surface, the surface of the silicon substrate 11 was subjected to gas phase cleaning with HCl gas at room temperature for 10 seconds. Subsequently, for 30 seconds the surface of the silicon substrate 11 was subjected to gas phase cleaning with oxygen gas containing 20 wt. % of ozone in order to remove organic contaminants and to form a thin oxide film (native oxide film) 13 on the surface of the silicon substrate 11.

Subsequently, as shown in FIG. 5B, the native oxide film 13 on the silicon substrate 11 was removed by exposing it to hydrofluoric acid anhydride (AHF) for 10 seconds.

These pre-treatments were performed in a dry atmosphere, and the silicon substrate 11 was not rinsed with de-ionized water. However, after the above-described treatments, the silicon substrate 11 may be rinsed with de-ionized water.

Subsequently, as shown in FIG. 5C, the silicon substrate 11 was exposed to hydrogen cyanide gas at 200° C. for 10 seconds. This cyanide treatment was performed in the same chamber in which the removal of the native oxide film and heavy metals and the like had been performed. In the present embodiment, hydrogen cyanide was used for cyanide treatment. However, other cyan compounds that are liquid at room temperature may be used. In this case, a liquid cyan compound which is stored in a constant-temperature bath and is maintained at a predetermined temperature is used. Inert gas such as nitrogen or argon is fed into the liquid cyan compound so that the liquid cyan compound bubbles, and the liquid cyan compound is introduced into the chamber by the inert gas. Moreover, instead of elevating the temperature, ultraviolet rays may be radiated onto the silicon substrate 11 during the cyanide treatment. Alternatively, application of heat and radiation of ultraviolet rays may be performed simultaneously.

Subsequently, as shown in FIG. 5D, the silicon substrate 11 was heated at 1050° C. in a dry oxygen atmosphere for 70 seconds through use of an unillustrated rapid thermal processing apparatus, in order to form a silicon oxide film 14 of 8 nm thickness. In the present embodiment, rinsing with de-ionized water was not performed before the oxidation process. However, rinsing with de-ionized water may be performed as needed.

Subsequently, as shown in FIG. 5E, a phosphorous-doped silicon film having a thickness of 200 nm was deposited on the silicon substrate 11 as an electrode layer at a deposition temperature of 540° C. such that the phosphorous concentration became $5 \times 10^{20}$ $cm^{-3}$ Subsequently, a gate electrode 15 was formed through use of photolithography in order to complete a MOS capacitor.

In the second embodiment, a gas was used for cyanide treatment. However, similar effects can be obtained through use of the method, as shown in the first embodiment, in which a silicon substrate is immersed into a cyan compound solution.

Needless to say, with regard to the semiconductor substrate, the insulating film, and the cyan compound, the same materials as those used in the first embodiment may be used.

In the second embodiment, a MOS capacitor was fabricated. However, similar effects can be obtained when the present embodiment is applied to other MOS devices such as MOS transistors. In addition to MOS devices, the present embodiment may be applied to a process of fabricating photodiodes used in photographing elements such as CCDs (charge coupled devices). In this case, the density of the interface states at the surface of the photodiodes can be reduced greatly. Especially, when the present embodiment is applied to a process of fabricating CCDs, defectives in relation to images such as a white-dot defective attributed to the density of the interface states can be greatly decreased.

Since the bonding force of cyanide ions ($CN^-$) with a semiconductor is very strong, the interface states reducing effect is not deteriorated by a subsequent heat treatment, unlike the case where hydrogen is used. Moreover, since the cyanide treatment does not require high-temperature heat treatment, the method of the present invention can be easily applied to actual manufacture of semiconductor devices.

Figure 6:
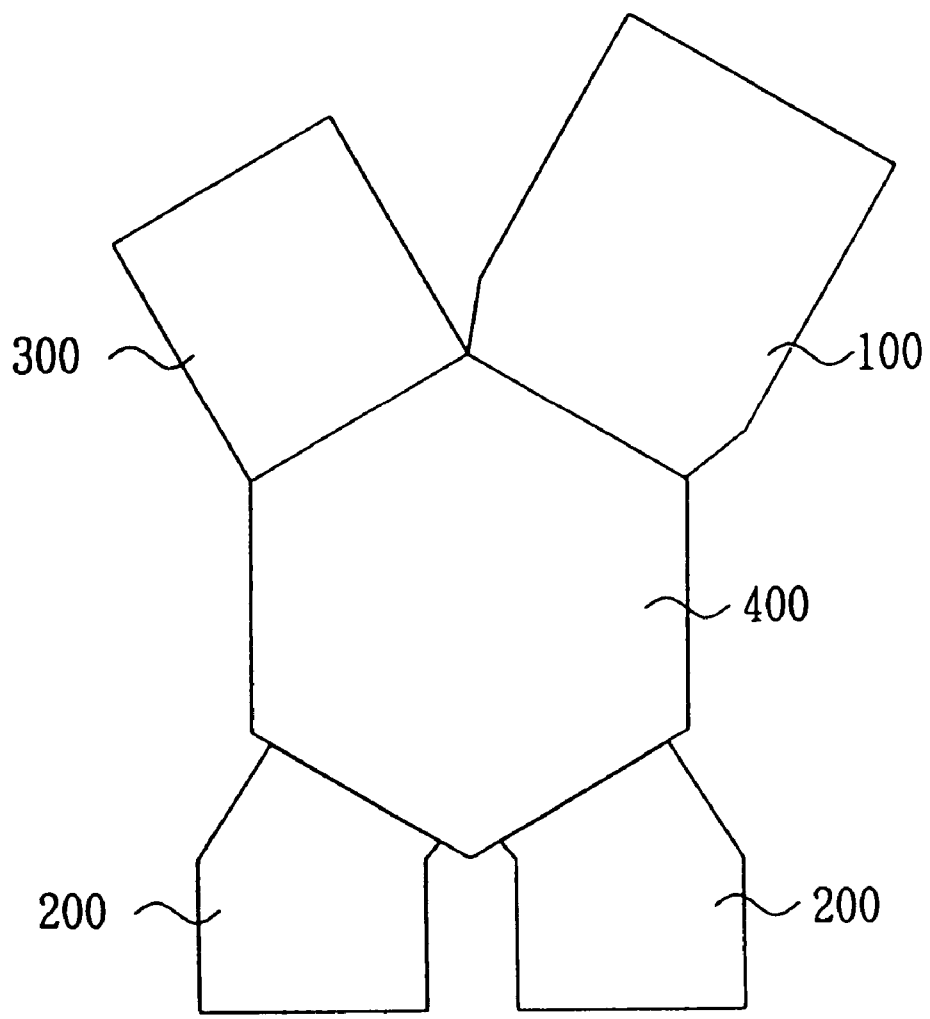
FIG. 6 is a view showing the layout of an apparatus for carrying out a cyanide treatment with a cyan compound gas in accordance with the second embodiment of the present invention.
Figure 7:
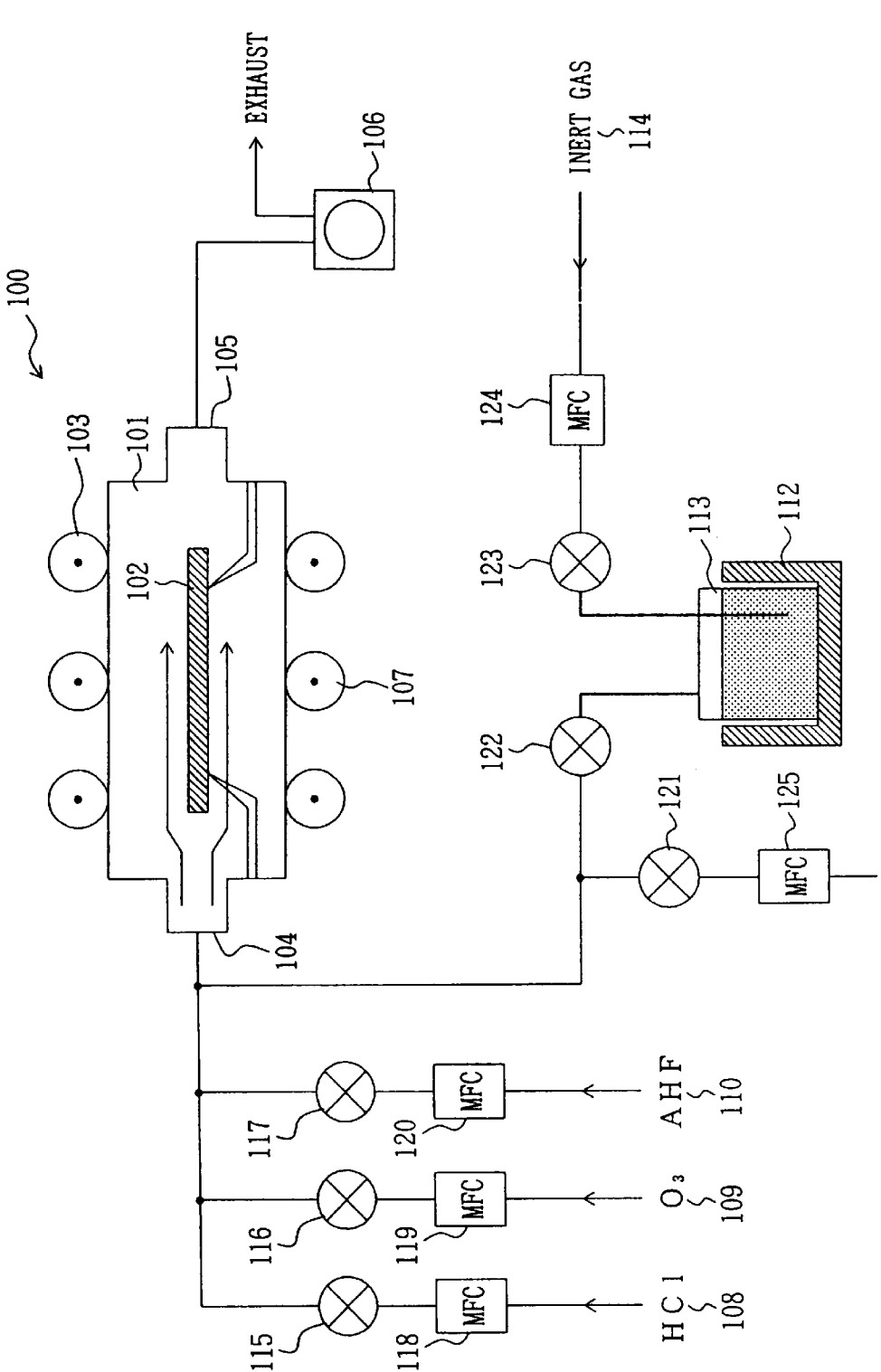
FIG. 7 is a view showing the structure of the reaction chamber shown in FIG. 6.
Figure 8:
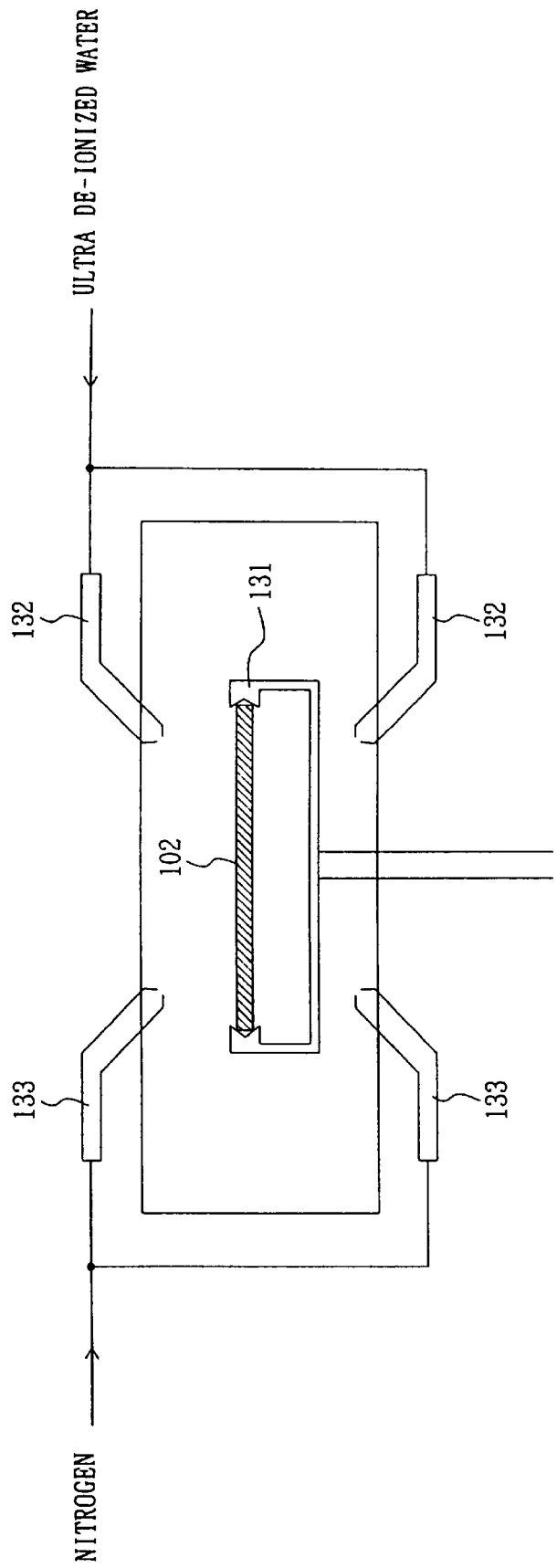
FIG. 8 is a view showing the structure of the post-treatment chamber shown in FIG. 6.

FIG. 6 shows the layout of an apparatus for carrying out a cyanide treatment with a cyanide compound gas in accordance with the second embodiment of the present invention; FIG. 7 shows the structure of the reaction chamber shown in FIG. 6; and FIG. 8 shows the structure of the post-treatment chamber shown in FIG. 6.

In FIG. 6, numeral 100 denotes a reaction chamber, numeral 200 denotes spare chambers, numeral 300 denotes a post-treatment chamber, and numeral 400 denotes a transfer chamber.

In FIG. 7, numeral 101 denotes a sapphire chamber, numeral 102 denotes a semiconductor wafer, numeral 103 denotes ultraviolet-ray arc lamps, numeral 104 denotes a gas introduction port, numeral 105 denotes an exhaust port, numeral 106 denotes a vacuum pump, numeral 107 denotes infrared-ray lamps, numeral 108 denotes HCl, numeral 109 denotes ozone, numeral 110 denotes anhydride HF, numeral 111 denotes a hydrogen cyanide (HCN) line, numeral 112 denotes a constant-temperature bath, numeral 113 denotes a bubbler, numeral 114 denotes an inert gas, numerals 115–117 and 112–123 denote valves, and numerals 118–120, 124 and 125 denote mass-flow controllers.

As shown in FIG. 7, the reaction chamber 100 is composed of a sapphire chamber 101. A single semiconductor wafer 102 is placed horizontally in the sapphire chamber 101. At the upper portion of the sapphire chamber 101 are disposed a plurality of the ultraviolet arc lamps 103 that radiate ultraviolet rays having a wavelength in the range of 150–450 nm. The ultraviolet arc lamps 103 enable radiation of ultraviolet rays onto the semiconductor wafer 102.

A gas is introduced from the gas introduction port 104 such that it induces laminar flow parallel to the semiconductor wafer 102, and is discharged from the exhaust port 105. In consideration of natural exhaustion and efficiency of replacement of gas, the vacuum pump 106 is disposed in the exhaust line. Therefore, the sapphire chamber 101 can be evacuated through use of the vacuum pump 106. In the apparatus of the present embodiment, in order to enable radiation of short-wavelength ultraviolet rays, the gas is caused to flow along the surface of the semiconductor wafer 102 parallel thereto. However, the gas introduction port 104 may be formed in a shower-head-like shape and may be disposed above the semiconductor wafer if the gas introduction port 104 can be formed of a material that is transparent with respect to ultraviolet rays in the short wavelength band.

At the lower portion of the sapphire chamber 101 are disposed a plurality of the infrared-ray lamps 107. The semiconductor wafer 102 is heated from its reverse surface by infrared rays radiated from the infrared-ray lamps 107. In the apparatus of the present embodiment, heat treatment can be performed at a temperature up to approximately 400° C. For cleaning of the semiconductor, removal of heavy metals, and removal of native oxide film, there are supplied HCl (indicated by 108), ozone (indicated by 109), and anhydride HF (indicated by 110).

The hydrogen cyanide (HCN) line 111 is used for cyanide treatment. If such a cyan compound is used, the constant-temperature bath 112 is used to store a cyan compound that becomes liquid at room temperature, Potassium cyanide (KCN) or the like is caused to bubble within the bubbler 113 through introduction of the inert gas 114 such as argon. As a result, potassium cyanide (KCN) or the like is introduced into the sapphire chamber 101 by the flow of the inert gas 114.

The apparatus of the present invention is also provided with the spare chambers 200 through which the semiconductor wafers 102 are transported to the chamber 101, as well as the post-treatment chamber 300 where rinsing with ultra deionized water and ozonized water is performed.

As shown in FIG. 8, the semiconductor wafer 102 is chucked at its peripheral edge by a chuck 131. De-ionized water or ozonized water is discharged from a nozzle 132 disposed above the semiconductor wafer 102, and at the same time, the semiconductor is rotated slowly for rinsing. After the rinsing, nitrogen is jetted from a nozzle 133 to the surface of the semiconductor wafer 102, and the rotational speed of the semiconductor wafer 102 is increased to a high speed. As a result, the semiconductor wafer 102 is dried.

The semiconductor wafer 102 can be freely transported between the spare chambers 200, the post-treatment chamber 300, and the sapphire chamber 101 via the transfer chamber 400. Therefore, if a heat treatment unit and a film forming unit are connected to the transfer chamber 400, the process up to and including a gate-electrode-formation process can be carried out successively.

The present invention is not limited to the above-described embodiments. Numerous modifications and variations of the present invention are possible in light of the spirit of the present invention, and they are not excluded from the scope of the present invention.

As described above, in the present invention, the density of interface states existing at the insulating film/semiconductor interface is reduced without use of hydrogen annealing or high-temperature annealing in an inert gas atmosphere. Moreover, the effect does not disappear even during subsequent heat treatment. Accordingly, the performance of MIS devices, especially, MOS devices, pn-junction photodiodes, MOS tunnel diodes is improved.

What is claimed is:

1. A method of manufacturing a semiconductor device comprising:
   forming an insulating film on a surface of a substrate of semiconductor material to form a substrate/insulating film interface therebetween; and
   prior to forming said insulating film, treating said surface of said substrate by contacting said surface with cyanide ions to reduce the interface states density at said interface.

2. A method of manufacturing a semiconductor device according to claim 1, wherein said exposing of the surface of the semiconductor substrate to cyanide ions ($CN^-$) is by dipping the semiconductor substrate into a cyan compound solution containing cyanide ions ($CN^-$).

3. A method of manufacturing a semiconductor device according to claim 1, wherein said cyan compound is a cyan compound selected from the group consisting of potassium cyanide (KCN), sodium cyanide (NaCN), hydrogen cyanide (HCN), and cyanogen [$(CN)^2$].

4. A method of manufacturing a semiconductor device according to claim 1, wherein said step of exposing the surface of the semiconductor substrate to cyanide ions ($CN^-$) is by exposing the semiconductor substrate to a cyan compound gas.

5. A method of manufacturing a semiconductor device according to claim 4, wherein said cyan compound is a cyan compound selected from a group consisting of potassium cyanide (KCN), sodium cyanide (NaCN), hydrogen cyanide (HCN), and cyanogen [$(CN)^2$].

6. A method of manufacturing a semiconductor device according to claim 1, wherein said semiconductor substrate is formed of a material selected from the group consisting of single crystal of silicon, polycrystalline silicon, amorphous silicon, gallium arsenide, and indium phosphide.

7. A method of manufacturing a semiconductor device according to claim 1, wherein said insulating film is formed of a material selected from the group consisting of silicon dioxide, silicon nitride, tantalum pentoxide ($Ta_2O_5$), BST ($BaSrTiO_3$), and STO ($SrTiO_3$).

8. A method of manufacturing a semiconductor device according to claim 1, wherein, when the surface of the semiconductor substrate is exposed to cyanide ions ($CN^-$), heat is applied to the semiconductor substrate and/or ultraviolet rays are radiated on the semiconductor substrate.

9. A method of manufacturing a semiconductor device according to claim 1 wherein said insulating film is formed by oxidizing said semiconductor material at said surface.

10. A method of manufacturing a semiconductor device comprising:

forming an insulating film on a surface of a substrate of semiconductor material to form a substrate/insulating film interface therebetween;

prior to forming said insulating film, treating said surface of said substrate by contacting said surface with cyanide ions to reduce the interface states density at said interface;

forming an electrically conductive film on the insulating film; and processing the electrically conductive film to form an electrode.

11. A method of manufacturing a semiconductor device according to claim 10, wherein said step of exposing said surface of said semiconductor substrate to cyanide ions ($CN^-$) is by dipping the semiconductor substrate into a cyan compound solution containing cyanide ions ($CN^-$).

12. A method of manufacturing a semiconductor device according to claim 11, wherein said cyan compound is a cyan compound selected from a group consisting of potassium cyanide (KCN), sodium cyanide (NaCN), hydrogen cyanide (HCN), and cyanogen [$(CN)^2$].

13. A method of manufacturing a semiconductor device according to claim 10, wherein said step of exposing said surface of the semiconductor substrate to cyanide ions ($CN^-$) is by exposing the semiconductor substrate to a cyan compound gas.

14. A method of manufacturing a semiconductor device according to claim 13, wherein said cyan compound is a cyan compound selected from the group consisting of potassium cyanide (KCN), sodium cyanide (NaCN), hydrogen cyanide (HCN), and cyanogen [$(CN)^2$].

15. A method of manufacturing a semiconductor device according to claim 10, wherein said semiconductor substrate is formed of a material selected from the group consisting of a single silicon crystal, polycrystalline silicon, amorphous silicon, gallium arsenide, and indium phosphide.

16. A method of manufacturing a semiconductor device according to claim 10, wherein, when said surface of said semiconductor substrate is exposed to cyanide ions ($CN^-$), heat is applied to the semiconductor substrate and/or ultraviolet rays are radiated on the semiconductor substrate.

17. A method of manufacturing a semiconductor device according to claim 10 wherein said insulating film is formed by oxidizing said semiconductor material at said surface.

18. A method of manufacturing a semiconductor device according to claim 17, wherein said insulating film is formed of a material selected from the group consisting of silicon dioxide, silicon nitride, tantalum pentoxide ($Ta_2O_5$), BST ($BaSrTiO_3$), and STO ($SrTiO_3$).

19. A method of manufacturing a semiconductor device comprising:

forming an insulating film on a surface of a substrate of semiconductor material to form a substrate/insulating film interface therebetween;

prior to forming said insulating film, treating said surface of said substrate by contacting said surface with cyanide ions to reduce the interface states density at said interface; and forming a transparent electrode on the insulating film.

20. A method of manufacturing a semiconductor device according to claim 19, wherein said step of exposing said surface of said semiconductor substrate to cyanide ions ($CN^-$) is by dipping the semiconductor substrate into a cyan compound solution containing cyanide ions ($CN^-$).

21. A method of manufacturing a semiconductor device according to claim 20, wherein said cyan compound is a cyan compound selected from the group consisting of potassium cyanide (KCN), sodium cyanide (NaCN), hydrogen cyanide (HCN), and cyanogen [$(CN)^2$].

22. A method of manufacturing a semiconductor device according to claim 19, wherein said step of exposing said surface of said semiconductor substrate to cyanide ions ($CN^-$) is by exposing the semiconductor substrate to a cyan compound gas.

23. A method of manufacturing a semiconductor device according to claim 22, wherein said cyan compound is a cyan compound selected from the group consisting of potassium cyanide (KCN), sodium cyanide (NaCN), hydrogen cyanide (HCN), and cyanogen [$(CN)^2$].

24. A method of manufacturing a semiconductor device according to claim 19, wherein said semiconductor substrate is formed of a material selected from the group consisting of a single silicon crystal, polycrystalline silicon, amorphous silicon, gallium arsenide, and indium phosphide.

25. A method of manufacturing a semiconductor device according to claim 19, wherein said insulating film is formed of a material selected from the group consisting of silicon dioxide, silicon nitride, tantalum pentoxide ($Ta_2O_5$), BST ($BaSrTiO_3$), and STO ($SrTiO_3$).

26. A method of manufacturing a semiconductor device according to claim 19, wherein, when said surface of said semiconductor substrate is exposed to cyanide ions ($CN^-$), heat is applied to the semiconductor substrate and/or ultraviolet rays are radiated on the semiconductor substrate.

27. A method of manufacturing a semiconductor device according to claim 19 wherein said insulating film is formed by oxidizing said semiconductor material at said surface.

* * * * *